(12) United States Patent
Birk

(10) Patent No.: US 6,826,208 B1
(45) Date of Patent: Nov. 30, 2004

(54) NONLINEAR TRANSMISSION LINE INTEGRATED CIRCUIT

(75) Inventor: Martin Birk, Shrewsbury, NJ (US)

(73) Assignee: AT&T Corp., New York, NY (US)

( * ) Notice: Subject to any disclaimer, the term of this patent is extended or adjusted under 35 U.S.C. 154(b) by 418 days.

(21) Appl. No.: 09/813,082

(22) Filed: Mar. 20, 2001

Related U.S. Application Data

(60) Provisional application No. 60/251,679, filed on Dec. 6, 2000.

(51) Int. Cl.[7] ................................................ H01S 3/10
(52) U.S. Cl. .................... 372/25; 372/38.1; 327/181; 327/195
(58) Field of Search .................... 372/25, 38.1, 26, 372/20, 33; 327/181, 195; 333/20, 33

(56) References Cited

U.S. PATENT DOCUMENTS

| | | | | |
|---|---|---|---|---|
| 4,855,696 A | * | 8/1989 | Tan et al. ...................... 333/20 |
| 5,023,574 A | * | 6/1991 | Anklam et al. ................ 333/20 |
| 5,274,271 A | * | 12/1993 | McEwan ...................... 307/108 |
| 5,352,994 A | * | 10/1994 | Black et al. ................... 333/33 |
| 5,422,607 A | * | 6/1995 | McEwan ....................... 333/20 |
| 5,434,693 A | * | 7/1995 | Tanaka et al. .............. 359/180 |
| 5,726,789 A | * | 3/1998 | Horiuchi et al. ............. 359/184 |
| 5,804,921 A | * | 9/1998 | McEwan et al. .............. 333/20 |
| 5,825,240 A | * | 10/1998 | Geis et al. ................... 327/570 |
| 5,923,574 A | | 7/1999 | Bechade ................ 364/715.04 |
| 5,969,929 A | * | 10/1999 | Kleveland et al. .......... 361/111 |
| 6,538,525 B1 | * | 3/2003 | Williamson ................... 333/20 |

* cited by examiner

Primary Examiner—Don Wong
Assistant Examiner—Leith Al-Nazer
(74) Attorney, Agent, or Firm—Michael Haynes PLC

(57) ABSTRACT

An all-silicon nonlinear transmission line (NLTL) is integrated with a pulse-forming circuit in the form of a reverse-biased diode. Relatively short, e.g., 27 ps, optical signals can be generated from the all-silicon NLTL circuit by laser modulation of the electrical NTLT output in an electro-optical system.

20 Claims, 4 Drawing Sheets

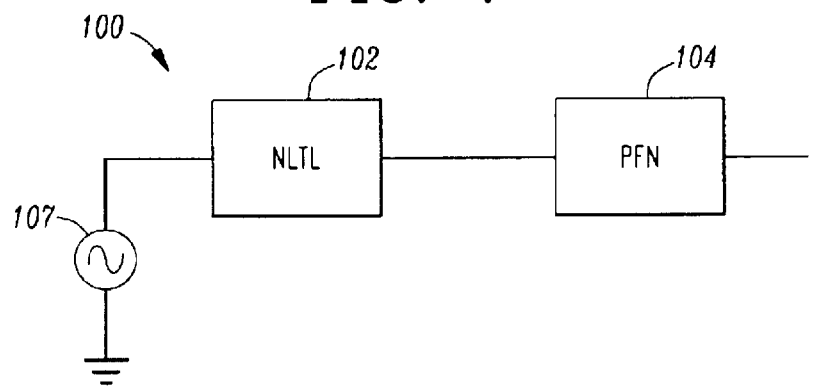
FIG. 1
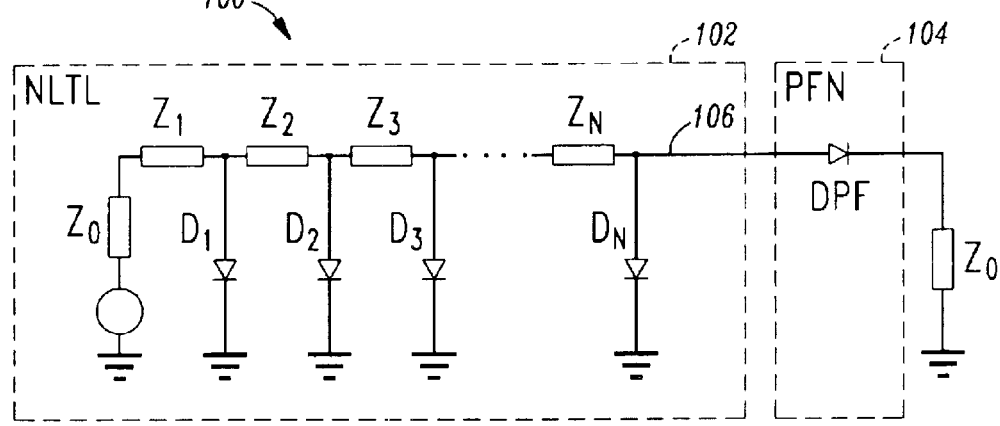
FIG. 2
FIG. 3A
FIG. 3B
FIG. 3C

NONLINEAR TRANSMISSION LINE INTEGRATED CIRCUIT

CROSS REFERENCE TO RELATED APPLICATIONS

The present application claims the benefit of U.S. Provisional Patent Application No. 60/251,679, filed on Dec. 6, 2000.

STATEMENT REGARDING FEDERALLY SPONSORED RESEARCH

Not Applicable.

FIELD OF THE INVENTION

The present invention relates generally to optical communication, and more particularly, to optical signal processing utilizing electrical nonlinear transmission line circuits.

BACKGROUND OF THE INVENTION

Nonlinear transmission lines (NLTLs) for generating fast time domain signals are well known in the art. In general, a voltage-dependent nonlinearity is distributed along a transmission line. One conventional NLTL implementation is an integrated circuit on semiconductor material including diodes and transmission lines. The nonlinear dependence of voltage and reverse-biased capacitance of the diode reduce the transient of a time domain signal applied to the input of the NLTL.

An exemplary NLTL is shown and described in U.S. Pat. No. 5,804,921 to McEwan et al. Typical NLTL circuits are formed from Gallium Arsenide (GaAs) and can produce transients on the order of several hundred femtoseconds.

GaAs semiconductor material has certain disadvantages compared to the widely known and used Silicon (Si) material, among which are cost and mechanical stability. Si wafers are relatively inexpensive and can be produced at greater sizes, reducing cost of the final integrated circuit. GaAs has the advantage of better drift mobility compared to Si, resulting in shorter transients at the output. However, sub-picosecond transients are not needed for certain applications.

Conventional return-to-zero (RZ) optical transmitters for modulating data streams include two Lithium-Niobate optical modulators, one for generating an optical pulse train and one for modulating the data onto the pulse stream. However, such an arrangement is relatively complex and expensive.

It would, therefore, be desirable to generate a pulse train in the electrical domain using an all-silicon nonlinear transmission line and pulse-forming circuit, modulate the pulse train in the electrical domain with data, and modulate the electrical RZ data stream onto an optical carrier using a single optical modulator.

SUMMARY OF THE INVENTION

The present invention provides an integrated nonlinear transmission line and pulse-forming network. The pulse-forming network can include a reverse-biased diode coupled in series with a conductive path of the nonlinear transmission line. With this arrangement, the nonlinear transmission line and the pulse-forming network can be easily integrated in an all-silicon structure.

In one aspect of the invention, an all-silicon integrated circuit includes a nonlinear transmission line and a pulse-forming circuit. In one embodiment, the nonlinear transmission line is monolithically integrated and includes a high-impedance co-planar waveguide and reverse-biased Schottky diodes. The diodes are periodically integrated into the waveguide at predetermined spacings. The pulse-forming network can include a capacitance in the form of a reverse-biased diode coupled to the nonlinear transmission line.

The nonlinear transmission line and the pulse-forming circuit can be integrated in an all-silicon configuration. The circuit can be fabricated using a high yield Si/SiGe, HBT process to provide compatibility with bipolar transistor process technology. With this process, the nonlinear transmission line can be integrated with heterostructure bipolar transistors for high-frequency circuit operation.

In a further aspect of the invention, an electro-optical system provides high-speed signal transmission with optical signal processing. In an exemplary embodiment, a data stream from a nonlinear transmission line and pulse-forming network is provided to an optical modulator that receives a laser signal. The modulator outputs an optical signal, such as return-to-zero pulses, having relatively small, e.g., 27 ps, pulse widths.

The electro-optical system can further include an electrical gate, such as a dual gate transistor, for modulating data, such as data coming from a bit error rate test set, onto an electrical RZ pulse stream. The gate output as well as a laser signal are provided to the optical modulator, which can generate a high-speed, e.g., ten Gbit per second, modulated return-to-zero signal.

In a further aspect of the invention, an electro-optical transmitter is integrated on a silicon substrate. In one embodiment, a nonlinear transmission line, a pulse-forming network, a gate, a laser, and a modulator are disposed on a high-resistivity silicon: substrate. This arrangement facilitates manufacture of the system with concomitant reductions in cost and complexity.

BRIEF DESCRIPTION OF THE DRAWINGS

The invention will be more fully understood from the following detailed description taken in conjunction with the accompanying drawings, in which:

FIG. 1 is a schematic block diagram of a nonlinear transmission line coupled to a pulse-forming network in accordance with the present invention;

FIG. 2 is a schematic diagram of an exemplary circuit implementation of the circuit of FIG. 1;

FIGS. 3A–3C are graphical representations of signals at various locations in the circuit of FIG. 1;

DETAILED DESCRIPTION OF THE INVENTION

FIGS. 1-2 show a circuit 100 including a nonlinear transmission line (NLTL) 102 coupled to a pulse-forming network 104 in accordance with the present invention. In an exemplary embodiment, the NLTL 102 includes a series of reverse-biased diodes D1–N (FIG. 2), such as Schottky diodes, integrated at predetermined locations between impedances $Z_0$–$Z_N$, which can be provided as inductive elements. The nonlinear transmission line 102 utilizes the voltage-dependent capacitances of the reverse-biased Schottky diodes D1–N, which are distributed along a high impedance transmission line 106 to introduce nonlinear wave propagation effects.

The capacitances and inductances of the nonlinear transmission line elements decrease in a direction of signal propagation such that the time constant, i.e., $(LC)^{1/2}$, concomitantly decreases. This arrangement, which can be referred to as a shockwave nonlinear transmission line, steepens a leading or falling edge of a large time-domain signal in a manner similar to a wave-breaking effect of water on beaches.

The pulse-forming network 104 can include a reverse-biased diode DPF coupled to the nonlinear transmission line NLTL. The pulse-forming network 104 differentiates the output from the NLTL 102. In one embodiment, the reverse-biased diode DPF of the pulse-forming network 104 is coupled to the NLTL 102 in the center of a waveguide, such as the waveguide shown in FIG. 4.

The pulse-forming network 104 uses the capacitance of the reverse-biased diode DPF to differentiate the saw-tooth output waveform of the NLTL. The capacitance of the reverse-biased diode corresponds to the space charge capacitance of the diode. In one particular embodiment, the capacitance is about 60 fF for a pulse width of 7 ps and about 15 fF for a pulse width of 1 ps.

As shown in FIGS. 3A-3C, a sine wave input (FIG. 3A) to the nonlinear transmission line 102 by a signal generator 107 (see FIG. 1) produces a saw-tooth signal (FIG. 3B). The pulse-forming network 104 receives the saw-tooth signal and generates an impulse signal (FIG. 3C).

Figure 4:
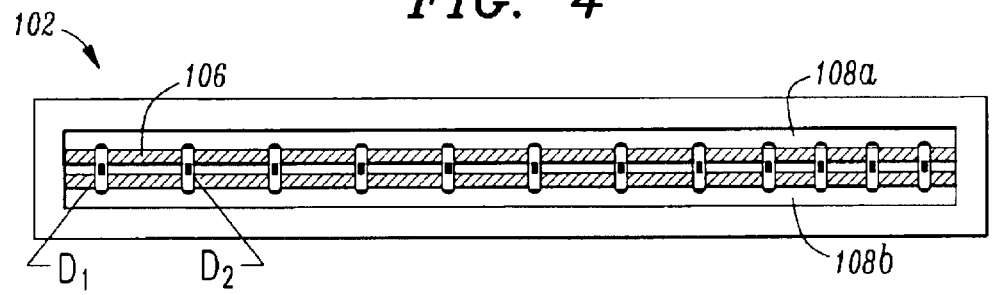
FIG. 4 is a pictorial representation of a fabricated nonlinear transmission line in accordance with the present invention.

FIG. 4 shows an exemplary implementation of the nonlinear transmission line 102 of FIGS. 1-2 disposed within a waveguide 108. Each of the reverse-biased diodes D1–N extends from the center conductor to the two grounds on either side. For example, the first diode D1 is coupled to the transmission line or center conductor 106 and first and second grounded walls 108a, 108b of the waveguide. In the illustrated embodiment, the waveguide 108 is a high impedance co-planar waveguide, which is readily understood by one of ordinary skill in the art.

The illustrated co-planar waveguide 108 has about a 20 μm center conductor 106 width, about a 40 μm air gap, and about 80 μm ground conductor width. The diode epitaxy in this example is homogeneous, but can also be pulse-doped or exponential. The doping concentration and thickness determine the behavior of the diode, e.g., the breakdown voltage, the cut-off frequency and the capacitance swing. In this example, the doping $N_D$ is about $3*10^{16} cm^{-3}$ and the thickness t is about 550 nm. The diode spacing is tapered to have good compression at higher losses at the input of the line and less compression but also lower losses at the output of the line. The spacing in the illustrated embodiment was done exponentially decreasing, starting at 300 μm and going down to 50 μm.

In an exemplary embodiment, the NLTL 102 of the present invention is fabricated from high-resistivity silicon, which renders the NLTL compatible with silicon millimeter wave integrated circuits (SIMMWIC). As used herein, high-resistivity silicon refers to a silicon substrate having a resitivity greater than about 500 Ohm cm. In one embodiment, the NLTL is integrated into a Si/SiGe HBT process to facilitate integration of Si/SiGe heterostructure bipolar transistors. This is in contrast to conventional NLTLs that are fabricated from Gallium Arsenide (GaAs). Exemplary SIMMWIC integrations include an integrated time domain sampler with additional functionality provided by a heterostructure bipolar transistor circuit, such as an operational amplifier. Further SIMMWIC integrations will be readily apparent to one of ordinary skill in the art.

Figure 5:
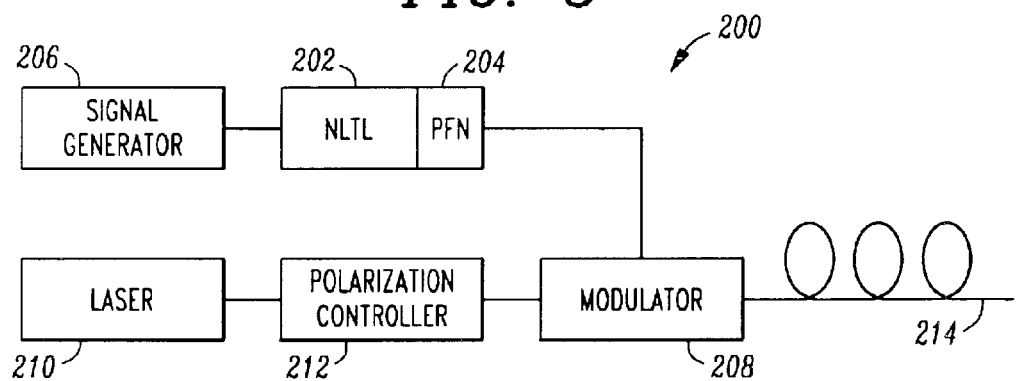
FIG. 5 is a block diagram of an elecro-optical system for generating optical pulses utilizing the nonlinear transmission line and pulse-forming network of FIG. 1.

FIG. 5 shows an electro-optical system 200 in accordance with the present invention including a NLTL 202 and pulse-forming network 204 described above. A signal generator 206 provides a signal, such as a sine wave signal, to the NLTL 202. The output of the pulse-forming network 204 is coupled to an optical modulator 208, which also receives a signal from a laser 210 via a polarization controller 212. The modulator 208 generates optical pulses 214 that can be transmitted to a desired location.

In an exemplary embodiment, the modulator 208 produces 10 Gbit/s RZ optical pulses with about 27 picoseconds full-width-at-half-maximum (FWHM). The pulses can be observed on an oscilloscope after conversion of the optical signal to the electrical domain.

Figure 6:
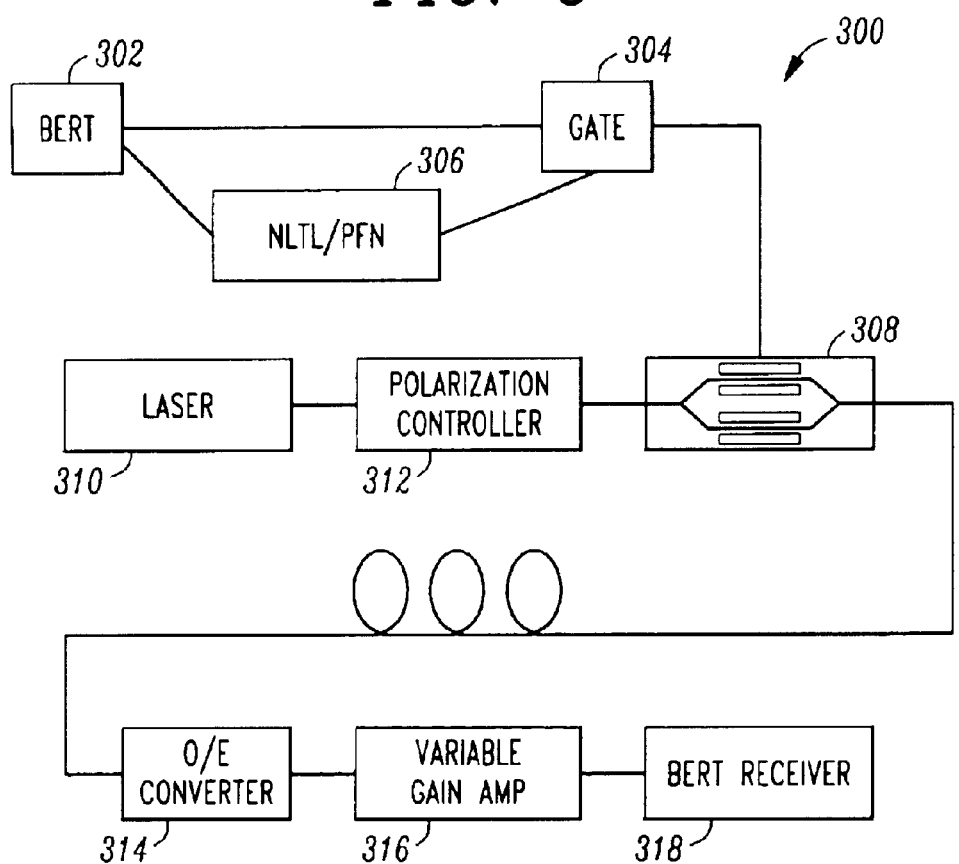
FIG. 6 is block diagram of an electro-optical system for generating a modulated return-to-zero bit stream with bit error rate measurement capability.

FIG. 6 shows an electro-optical system 300 including a bit error rate test (BERT) set 302 that provides an input signal, e.g., 10 Gbit/s NRZ, to a gate 304, such as a dual-gate field effect transistor (FET), and a 10 GHz sine wave, for example, to a nonlinear transmission line and pulse-forming network 306. Dual-gate transistors are well known to one of ordinary skill in the art. The gate 304 modulates the output signal from the NLTL/PFN circuit 306 with the BERT signal and provides the modulated signal to an optical modulator 308, such as a LiNbO3 Mach-Zehnder modulator or electro-absorption modulator. The modulator 308 also receives a CW optical carrier signal from a laser 310 via a polarization controller 312. The dual-gate FET 304 samples the NRZ signal on one gate with the short electrical pulses applied to the other gate. The pulses are applied to the faster gate of the FET.

An optical-to-electrical signal converter 314 can convert the modulator 308 output signal to the electrical domain for amplification by a variable gain amplifier 316, for example. A BERT receiver 318 can then determine a bit-error-rate (BER) for the system.

Figure 7:
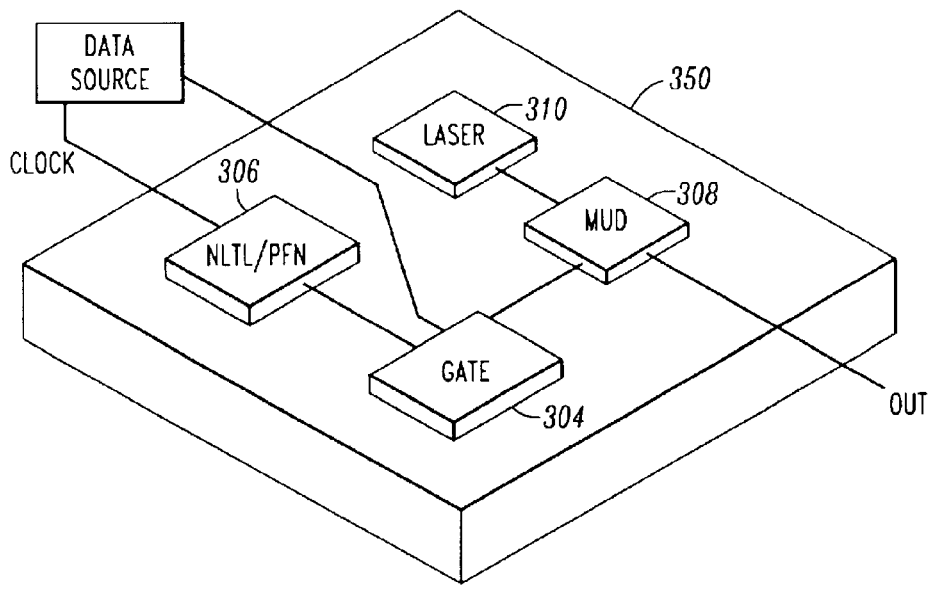
FIG. 7 is a schematic representation of an electro-optical system for generating a modulated return-to-zero bit stream integrated on a substrate in accordance with the present invention.

It is understood that a wide variety of gates, modulators, and data formats can be used. Gates can include switching circuits that can be rapidly controlled, such as a diode switch. Modulators can include optical modulators that are capable of relatively high speeds, such as electro-absorption, LiNbO3 and polymer modulators. Exemplary data formats include RZ and NRZ As shown in FIG. 7, the NLTL/PF circuit 306, the electro-absorption modulator 308, the gate 304 and the laser 310, such as a DFB laser in a flip-chip module, are integrated on a single silicon substrate 350. In one particular embodiment, a Si/SiGe HBT process is used to fabricate the device. This arrangement significantly reduces system complexity, decreases overall fabrication costs, and minimizes equipment failures.

In an exemplary embodiment, a 10 GHz sine wave at a power of 24 dBm is applied to the input of the NLTL that provides an output signal to a driver amplifier and a 10 GHz LiNbO$_3$ Modulator to produce about 27 ps FWHM optical pulses. The optical pulses in this measurement are chirped, since the driver is only connected to one side of the modulator. The bandwidth-FWHM product of the pulses is in the order of 0.4, which would be improved to no chirp by using an electrical amplifier to drive both modulator sides.

EXAMPLE

An electrical pulse train from an all silicon NLTL and pulse-forming circuit was modulated with a pseudo-random bit stream (length $2^{31}-1$) by applying a NRZ signal from a bit-error-rate test set (BERT) to one gate of a dual-gate field effect transistor in a hybrid package and the pulse train to the other gate. The resulting RZ pulses at the gate output were amplified in order to directly drive a 10-GHz LiNbO$_3$ modulator, that followed a 1.55 micrometer semiconductor laser. After detection by a 13-GHz optical-to-electrical converter, the output was amplified and the error rate was measured.

Figure 8:
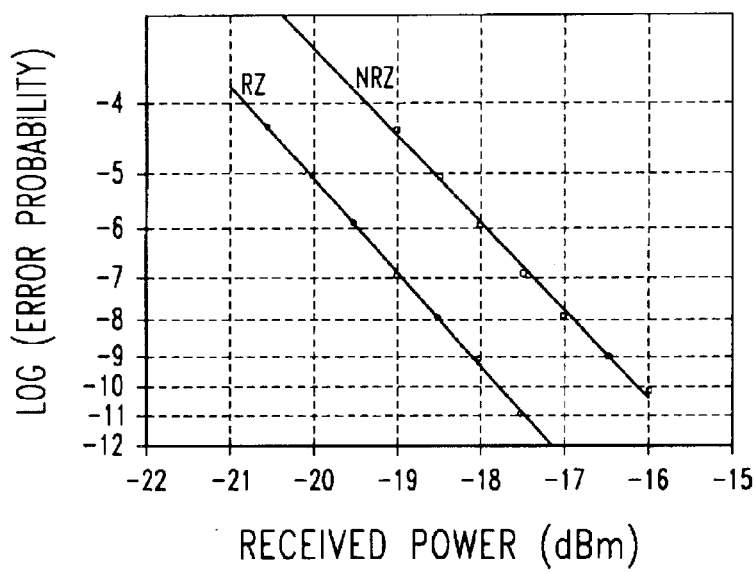
FIG. 8 is a graphical depiction of a comparison of RZ and NRZ for an electro-optical system in accordance with the present invention.

Before taking measurements, certain parameters were optimized, such as the modulator DC-bias, NLTL bias, decision threshold and the phase of the signal. FIG. 8 shows measured bit-error-rates (BER) as a function of the received power at 10 Gbit/s, which indicates a receiver sensitivity of about −18.2 dBm at a bit-error-rate of $10^{-9}$. For comparison, an optimized NRZ measurement without NLTL and dual-gate FET was also performed. As can be seen in FIG. 8, the gain in sensitivity is about 1.5 dB for RZ over NRZ signaling. Integrating a transistor directly with the NLTL in a Si/SiGe HBT process provides about a 2 dB improvement due to a reduction in wiring parasitics.

The present invention provides a system for generating relatively short, e.g., 27 ps, FWHM optical pulses using an all-silicon nonlinear transmission line integrated with a pulse-forming network. The system utilizes the all-silicon NLTL to transmit optical date at 10 Gbit/s data rates. The integrated structure of the invention reduces complexity and cost.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A circuit, comprising:
    a nonlinear transmission line circuit having an input and an output; and
    a pulse-forming circuit coupled to the nonlinear transmission line, the pulse-forming circuit including a reverse-biased diode coupled in series with the output of the nonlinear transmission line circuit.

2. The circuit according to claim 1, further including a co-planar waveguide in which the nonlinear transmission line is disposed.

3. The circuit according to claim 1, wherein the circuit is fabricated from high-resistivity silicon.

4. The circuit according to claim 1, wherein the nonlinear transmission line includes
    a plurality of reverse-biased Schottky diodes coupled to a central conductor.

5. The circuit according to claim 1, further including a gate device coupled to the pulse-forming circuit.

6. The circuit according to claim 5, further including a modulator coupled to the gate and a laser coupled to the modulator for generating optical pulses.

7. The circuit according to claim 6, wherein the modulator is a 10 GHz LiNbO$_3$ modulator.

8. The circuit according to claim 7, wherein the circuit generates signals at a rate of at least 10 Gbit/s.

9. The circuit according to claim 7, wherein the circuit generates optical pulses less than about 27 picoseconds FWHM.

10. The circuit according to claim 7, wherein the gate is a dual-gate FET.

11. The circuit according to claim 10, wherein the gate is a Si/SiGe heterostructure bipolar transistor.

12. A data transmission system, comprising:
    a nonlinear transmission line;
    a pulse-forming circuit coupled to a first end of the nonlinear transmission line a second end of the nonlinear transmission line adapted to be coupled to a periodic signal generator;
    a gate coupled to the pulse-forming circuit;
    an optical modulator coupled to the gate; and
    a laser coupled to the modulator.

13. The system according to claim 12, wherein the system is integrated on a silicon substrate.

14. The system according to claim 12, wherein the gate includes a dual-gate FET.

15. The system according to claim 12, wherein the pulse-forming circuit includes a reverse-biased diode.

16. A method of generating optical pulses, comprising:
    electrically modulating an output signal from a pulse-forming circuit coupled to a first end of a nonlinear transmission line, a second end of the nonlinear transmission line coupled to a periodic signal generator; and
    modulating an output signal from the pulse-forming circuit with a laser-generated signal to provide an optical signal.

17. The method according to claim 16, wherein the pulse-forming circuit includes a reverse-biased diode coupled to the nonlinear transmission line.

18. The method according to claim 16, further including inserting the nonlinear transmission line within a waveguide.

19. The method according to claim 16, further including fabricating the nonlinear transmission line from high-resistivity silicon.

20. The method according to claim 16, further including integrating a gate, the modulator, the laser, the nonlinear transmission line, and the pulse-forming circuit on a silicon substrate.

* * * * *